(12) United States Patent
Brandes

(10) Patent No.: US 8,297,061 B2
(45) Date of Patent: Oct. 30, 2012

(54) OPTOELECTRONIC DEVICE WITH UPCONVERTING LUMINOPHORIC MEDIUM

(75) Inventor: George R. Brandes, Raleigh, NC (US)

(73) Assignee: Cree, Inc., Durham, NC (US)

( * ) Notice: Subject to any disclaimer, the term of this patent is extended or adjusted under 35 U.S.C. 154(b) by 1253 days.

(21) Appl. No.: 11/832,785

(22) Filed: Aug. 2, 2007

(65) Prior Publication Data
US 2009/0034201 A1  Feb. 5, 2009

(51) Int. Cl.
*F25B 21/00* (2006.01)
(52) U.S. Cl. .......................... 62/3.1; 62/259.2
(58) Field of Classification Search .................. 62/3.1
See application file for complete search history.

(56) References Cited

U.S. PATENT DOCUMENTS

| | | | |
|---|---|---|---|
| 3,529,200 A * | 9/1970 | Potter et al. ................ 313/501 |
| 3,593,055 A | 7/1971 | Geusic et al. |
| 3,763,405 A | 10/1973 | Mitsuhata |
| 3,932,881 A | 1/1976 | Mita et al. |
| 5,208,462 A | 5/1993 | O'Connor et al. |
| 5,447,032 A * | 9/1995 | Epstein et al. .................. 62/3.1 |
| 6,041,610 A * | 3/2000 | Edwards et al. ................ 62/264 |
| 6,078,704 A | 6/2000 | Bischel et al. |
| 6,275,211 B1 | 8/2001 | Flannery |
| 6,312,914 B1* | 11/2001 | Kardos et al. .................... 435/6 |
| 6,378,321 B1* | 4/2002 | Epstein et al. .................. 62/264 |
| 6,593,055 B2* | 7/2003 | Shimazu et al. .............. 430/166 |
| 6,600,175 B1 | 7/2003 | Baretz et al. |
| 6,665,044 B1* | 12/2003 | Jacobsen et al. ............. 349/187 |
| 6,863,219 B1 | 3/2005 | Jacobsen et al. |
| 6,990,903 B2 | 1/2006 | Butland |
| 7,113,663 B1 | 9/2006 | Spoonhower et al. |
| 7,141,446 B2 | 11/2006 | Brewer et al. |
| 7,180,065 B2 | 2/2007 | Craig et al. |
| 7,218,527 B1 | 5/2007 | Jacobsen |
| 7,272,275 B2 | 9/2007 | Spoonhower et al. |
| 2003/0030067 A1* | 2/2003 | Chen .............................. 257/102 |
| 2003/0213964 A1* | 11/2003 | Flynn et al. ....................... 257/85 |
| 2004/0016938 A1 | 1/2004 | Baretz et al. |

(Continued)

FOREIGN PATENT DOCUMENTS

| WO | 9930220 A1 | 6/1999 |
|---|---|---|
| WO | 2007084640 A2 | 7/2007 |

OTHER PUBLICATIONS

De S. Menezes et al., "Photon-assisted cooperative energy transfer and frequency upconversion in a Yb3+/Tb3+ codoped fluoroindate glass", Journal of Applied Physics, vol. 94, No. 2, Jul. 15, 2003, pp. 863-866.

(Continued)

*Primary Examiner* — Melvin Jones
(74) *Attorney, Agent, or Firm* — Hulquist, PLLC; Steven J. Hulquist; Frank J. Bozzo

(57) ABSTRACT

A microelectronic device that in operation generates or includes component(s) that generate heat, in which the device comprises a heat conversion medium that converts such heat into a light emission having a shorter wavelength than such heat, to thereby cool the device and dissipate the unwanted heat by such light output. The heat conversion medium can include an upconverting luminophoric material, e.g., an anti-Stokes phosphor or phosphor composition. The provision of such heat conversion medium enables thermal management of microelectronic devices, e.g., optoelectronic devices, to be achieved in an efficient manner, to prolong the operational service life of devices such as LEDs, laser diodes, etc. that are degraded in performance by excessive heat generation in their operation.

41 Claims, 2 Drawing Sheets

U.S. PATENT DOCUMENTS

| | | | |
|---|---|---|---|
| 2005/0064604 A1* | 3/2005 | Bohmann et al. | 436/525 |
| 2005/0200271 A1* | 9/2005 | Juestel et al. | 313/503 |
| 2005/0283145 A1* | 12/2005 | Malak | 606/20 |
| 2006/0049416 A1 | 3/2006 | Baretz et al. | |
| 2006/0152140 A1* | 7/2006 | Brandes | 313/503 |
| 2006/0237636 A1* | 10/2006 | Lyons et al. | 250/228 |
| 2007/0096057 A1* | 5/2007 | Hampden-Smith et al. | 252/301.16 |
| 2008/0090726 A1* | 4/2008 | Eskra et al. | 503/207 |

OTHER PUBLICATIONS

Pires A. M. et al., "Yttrium oxysulfide nanosized spherical particles doped with Yb and Er or Yb and Tm: efficient materials for up-converting phosphor technology field", Journal of Alloys and Compounds, vol. 374, No. 1-2, pp. 181-184.

Rich T. C. et al., "Exploring the Ultimate Efficiency in Infrared-to-Visible Converting Phosphors Activated with Er and Sensitized with Yb", Journal of Applied Physics, vol. 43, No. 5, May 1972, pp. 2357-2365.

Hoyt, C.W., et al., "Observation of Anti-Stokes Fluorescence Cooling in Thulium-Doped Glass", "Phys. Rev. Lett.", Oct. 23, 2000, pp. 3600-3603, vol. 85, No. 17.

Mita, Yoh, "Chapter 12—Section One: Other Phosphors", "Phosphor Handbook—Shionoya and Yen, eds.", 1998, pp. 643-650.

* cited by examiner

OPTOELECTRONIC DEVICE WITH UPCONVERTING LUMINOPHORIC MEDIUM

FIELD OF THE INVENTION

The present invention relates to optoelectronic devices, and to methods and arrangements for operation and/or thermal management of such devices to achieve improved performance, by the use of upconverting media.

DESCRIPTION OF THE RELATED ART

Heat generation is a persistent problem in electronic devices, since excessive heating can damage microelectronic components and circuitry as well as degrade device performance. Present approaches to dissipating heat in integrated circuitry and microelectronic devices rely on heat sinks, fans, coolant media, and other heat transfer means to ensure that operation of the device or circuitry is maintained within desired limits.

Optoelectronic devices are subject to the same thermal management issues as electronic devices generally, and utilize corresponding approaches of dissipating heat via conduction, radiation, convection and/or direct mechanical cooling.

Optoelectronic devices may employ upconverting luminophoric media to convert a primary radiation input to a higher frequency radiation output. Examples include harmonic optoelectronic mixers, optoelectronic photodetector devices, planar waveguide amplifiers, fluorescent resonance energy transfer (FRET) devices, etc., as used in a wide variety of applications such as imaging, video processing, optical data storage, subcarrier modulation, etc.

It would be highly advantageous to achieve thermal management of optoelectronic devices in a manner that not only avoids heat-related degradation and damage to such devices, but also achieves increased outputs from such devices as a result of the thermal management techniques that are employed. There is an emerging need for such innovation, in the context of increasing temperatures of light emitting diodes (LEDs) in current and anticipated future lamp designs.

SUMMARY OF THE INVENTION

The present invention relates to microelectronic devices, e.g., optoelectronic devices such as light emitting diodes (LEDs), and to methods and arrangements for operation and/or thermal management of such devices to achieve improved performance.

The invention in one broad aspect relates to a microelectronic device that in operation generates or includes component(s) that generate heat, in which the device comprises a heat conversion medium, including an emissive conversion material, that converts such heat into a light emission having a shorter wavelength than such heat.

In another broad aspect, the invention relates to a microelectronic device that in operation generates or includes component(s) that generate heat, in which the device comprises a heat conversion medium that converts the heat to a light emission that is effective to dissipate the heat.

Another aspect of the invention relates to a microelectronic device that in operation generates or includes component(s) that generate heat, in which the device comprises an upconverting material that produces upconverted light in response to heat, an external light source and/or energy from an active region of the microelectronic device.

The invention a further aspect relates to a microelectronic device comprising a heat-generating structure producing heat in operation of the device, and an upconverting luminophoric material that in exposure to such heat responsively converts the heat to light, to thereby cool the device and dissipate the heat by such light.

In another aspect, the invention relates to a microelectronic device generating heat in operation of the device, and an upconverting material arranged to reduce the thermal energy of the device and/or to produce light in the visible spectrum, in exposure of the upconverting material to such heat.

A further aspect of the invention relates to a microelectronic device including multiple upconverting materials, including a first upconverting material that is responsive to thermal energy to produce upconverted light, and a second upconverting material that produces upconverting light in response to thermal energy, the upconverted light and/or energy from an active region of the microelectronic device.

Another aspect of the invention relates to a microelectronic device including an upconverting material and a down-converting material, each arranged for energetic interaction in the device.

In yet another aspect, the invention relates to a microelectronic device including multiple upconverting and/or down-converting elements that are responsive to energy emitted by any of light emitting regions of the microelectronic device to produce a predetermined light output spectrum for the microelectronic device.

Another aspect of the invention relates to a composite material comprising anti-Stokes phosphor and Stokes phosphor.

In a broad method aspect, the invention relates to a method of thermally managing a microelectronic device, comprising incorporating therein an upconverting material that produces upconverted light in response to heat, an external light source and/or energy from an active region of the microelectronic device.

In a further aspect, the invention relates to a method of thermally managing a microelectronic device generating heat in operation, comprising absorbing the heat with an upconverting luminophoric material that in exposure to such heat responsively converts the heat to a light output, to thereby cool the device and dissipate the heat by such light output.

In another method aspect, the invention relates to a method of thermally managing a microelectronic device generating heat in operation of the device, comprising reducing the thermal energy of the device by interaction thereof with an upconverting material and/or producing light in the visible spectrum, in exposure of the upconverting material to heat generated by the device.

A further method aspect of the invention relates to a method of thermally managing a microelectronic device, comprising incorporating multiple upconverting materials therein, including a first upconverting material that is responsive to thermal energy to produce upconverted light, and a second upconverting material that produces upconverting light in response to thermal energy, the upconverted light from the first upconverting material, an external light source and/or energy from an active region of the microelectronic device.

A still further aspect of the invention relates to a method of thermally managing a microelectronic device, comprising incorporating therein an upconverting material that produces upconverted light in response to thermal energy, the upconverted light from the first upconverting material, an external light source and/or energy from an active region of the microelectronic device.

Another aspect of the invention relates to a method of thermally managing a microelectronic device, comprising incorporating an upconverting material and a down-converting material therein, each arranged for energetic interaction in the device.

A further aspect of the invention relates to a method of fabricating a microelectronic device, comprising incorporating in said microelectronic device multiple upconverting and/or down-converting elements that are responsive to energy emitted by any of light emitting regions of the microelectronic device to produce a predetermined light output spectrum for the microelectronic device.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
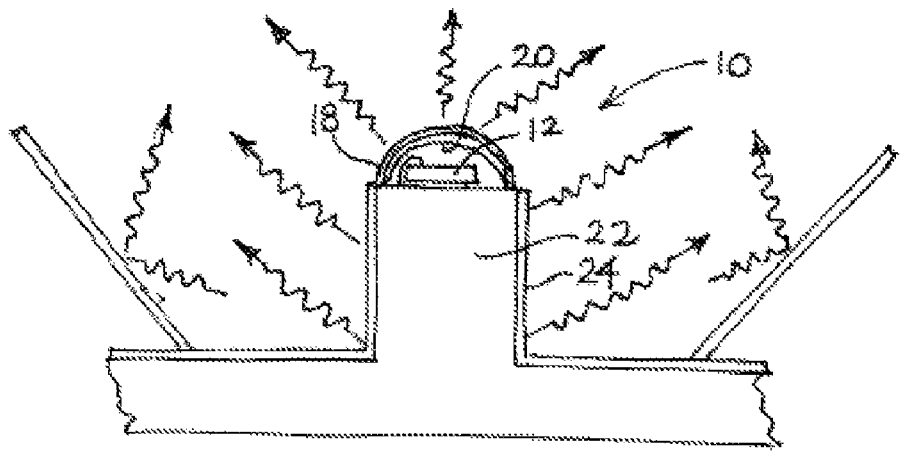
FIG. 1 is an elevation view, in partial section, of an optoelectronic light emission assembly including a light emitting diode and a down-converting luminophoric medium arranged to receive primary radiation from the light emitting diode, in which the optoelectronic light emission assembly includes an anti-Stokes phosphor film on side surfaces of the light emitting diode support.

The present invention relates to microelectronic devices, e.g., optoelectronic devices including light emitting diodes (LEDs), and to methods and arrangements for thermal management of such devices to achieve improved performance.

The term "anti-Stokes" as used herein in reference to luminophoric (light-emitting) materials refers to materials that do not conform to Stoke's second law that a material's luminescent emission is lower in photon energy than absorbed incident photon energy. A Stokes material, by contrast, follows such law, and exhibits a so-called Stokes shift when it absorbs incident radiation and responsively emits luminescence of a lower energy, at longer wavelength.

By way of example, an anti-Stokes material such as a phosphor may be sensitive to radiation in a wavelength range of 1500-1610 nm and responsively emit light in a wavelength range of 950-1075 nm. Many such materials are known, including materials doped with triply ionized rare earth ions such as erbium ($Er^{3+}$), yrbium ($Yb^{3+}$) or thulium ($Tm^{+3}$). One such material is a $Tm^{+3}$-doped $ZrF_4$—$BaF_2$—$LaF_3$—$AlF_3$—$NaF$—$PbF_2$ material. Other suitable materials include, without limitation, $Y_2O_2S$:Yb,Tm; $La_2O_2S$:Er,Yb; $Y_2O_2S$:Er,Yb; $YF_3$:Er,Yb; $Y_2O_3$—YOF:Er,Yb; and YOCl:Er,Yb.

The invention in one aspect relates to a microelectronic device that in operation generates or includes component(s) that generate heat, the device comprising a heat conversion medium that converts such heat into a light emission having a shorter wavelength than such heat. By such arrangement, the microelectronic device is cooled, to a greater extent, in relation to a corresponding microelectronic device lacking such heat conversion medium, in which the heat is dissipated by radiative cooling of the microelectronic device.

In one embodiment, the invention contemplates a microelectronic device comprising a heat-generating structure producing heat in operation of the device, and an upconverting luminophoric material that in exposure to such heat responsively converts the heat to a light output, to thereby cool the device and dissipate the heat by such light of a higher frequency.

In another embodiment, the invention contemplates a microelectronic device that in operation generates or includes component(s) that generate heat, in which the device comprises an upconverting material that produces upconverted light in response to heat, an external light source and/or energy from an active region of the microelectronic device. In certain embodiments, the microelectronic device is an optoelectronic device, such as a light-emitting diode or a laser diode, and the upconverting material can reduce the thermal energy and/or produce light in the visible spectrum.

In other embodiments, the microelectronic device can include multiple upconverting materials, and a first upconverting material is responsive to thermal energy to produce upconverted light, and a second upconverting material produces upconverting light which is responsive to thermal energy, the upconverted light from the first upconverting material and/or energy from the active region of the microelectronic device. In even further embodiments, the second upconverting material can be responsive to the energy produced from a down-converting material.

In another aspect, the invention relates to a microelectronic device comprising an upconverting material, such as an anti-Stokes phosphor, and a down-converting material, such as a Stokes phosphor. In certain embodiments, the down-converting energy upconverts thermal energy to visible light, and the down-converting phosphor is responsive to the energy emitted from the active region of the microelectronic device to produce downconverted light.

In certain other embodiments, both the upconverted and downconverted light are in the visible spectrum, and the converting materials are provided in the form of a composite material comprising an anti-Stokes phosphor and a conventional Stokes phosphor.

In further embodiments, the microelectronic device can include multiple down-converting and/or upconverting elements that are responsive to energy emitted by any of the light-emitting regions of the microelectronic device to produce a particular output light spectrum for the microelectronic device.

A further aspect of the invention relates to a method of thermally managing a microelectronic device generating heat in operation, comprising absorbing the heat with an upconverting luminophoric material that in exposure to such heat responsively converts the heat to a light output, to thereby cool the device and dissipate the heat by such light output.

The present invention in various specific embodiments employs an upconverting luminophoric medium for conversion of heat into visible light, to effect cooling of an optoelectronic device.

More specifically, an anti-Stokes phosphor can be employed as a coolant medium for conversion of waste heat generated in the operation of an optoelectronic device into visible light radiation. Anti-Stokes phosphors include materials that have the capability of absorbing 2-3 photons of long wavelength radiation, e.g., in the infrared spectral region, and upconverting such radiation to emit a single photon of visible light radiation, as well as other materials that display anti- Stokes behavior in absorbing one infrared photon in conjunction with a visible light photon. This behavior contrasts with the response of conventional phosphors that follow Stoke's Law, according to which luminescence having a longer wavelength is generated by shorter wavelength exciting radiation.

The present invention in various embodiments is based on the discovery that anti-Stokes phosphors can be usefully employed to convert heat generated in an optoelectronic device to a light output, with the anti-Stokes phosphor being excited by heat (e.g., photonic and/or phononic heat energy) to emit such light output.

The anti-Stokes phosphor in accordance with the invention in one embodiment is arranged to receive the heat input from the optoelectronic device assembly, e.g., by direct conduction and/or radiative heat transfer, and to effect the conversion of such heat energy into light emission.

By such arrangement, the optoelectronic device assembly is thermally managed so that the waste heat generated in operation is dissipated to light energy. Such complement of light energy can be employed to augment the output of the optoelectronic device, if the optoelectronic device is of a type that is adapted for light emission, such as a light emitting diode, LED-based lamp assembly, display, or the like, or otherwise as a photonic signal source in the device, as a dissipative medium for removing the heat generated in the operation of the device, or as an indicator signal for thermally excessive conditions in the device.

In such manner, the anti-Stokes phosphor medium provides a cooling function that ameliorates or even eliminates the adverse effects of heat generation in the operation of the optoelectronic device. As a result, device fabrication is simplified, since conventional thermal ballast structures, fans, heat exchangers are unnecessary, or at the very least can be substantially reduced in size. Further, by reducing the thermal load on the electronic device assembly, the service life of heat-sensitive components of such assembly are correspondingly increased, so that the assembly is capable of sustained operation before repair or replacement is necessary.

The anti-Stokes phosphor utilized in the various embodiments of the invention may be of any suitable type, e.g., a phosphor that is constituted and arranged to absorb heat energy from the electronic device assembly and convert same to a heat-dissipative light output. Examples of anti-Stokes phosphors that may be usefully employed in the broad practice of the present invention include, without limitation, anti-Stokes phosphors of the formula L:M, wherein L is yttrium oxide, yttrium fluoride, yttrium oxyfluoride, yttrium oxychloride, yttrium oxysulfide, or ytterbium oxychloride, and M is one or more of ytterbium, erbium, and thulium.

Specific examples of anti-Stokes phosphors of such type that may be usefully employed in specific applications include, without limitation, $Y_2O_2S:Yb,Tm$; $La_2O_2S:Er,Yb$; $Y_2O_2S:Er,Yb$; $YF_3:Er,Yb$; $Y_2O_3$—$YOF:Er,Yb$; $YOCl:Er,Yb$; $YbOCl:Er$; and $Tm^{+3}$—doped $ZrF_4$—$BaF_2$—$LaF_3$—$AlF_3$—$NaF$—$BpF_2$.

Anti-Stokes phosphor material can be deposited on a specific substrate or surface of a particular component in any suitable manner, such as forming a film of the phosphor from a slurry including the phosphor in powder or other particulate form in combination with a solvent or suspending medium, followed by evaporation or other removal of the solvent or suspending medium, to yield the surface film of the phosphor.

The anti-Stokes phosphor may also be deposited using electrophoretic deposition, screen printing, sputtering, chemical vapor deposition or any of other suitable deposition techniques. One or more anti-Stokes phosphors may be usefully employed along with one or more conventional phosphors and one or more LEDs. The anti-Stokes phosphors and conventional phosphors may be applied as a mixture to coat certain surfaces of the microelectronic device assembly, or the phosphors may be applied in layers. Such phosphors may also be formulated with or on supportive or reinforcing materials or structures, to form free-standing or supported phosphor layers in the microelectronic device assembly.

The location, thickness, density, and compositions of the phosphors may be altered to achieve a desired optical output while retaining the cooling character of the heat-dissipating generation of light afforded by such phosphors. The special distribution of the phosphors may also be altered so that only certain microelectronic devices, or one or more active portions thereof, interact with none, some or all of the phosphors present. Binding materials, light scatterers, transmissive structures, etc., may be employed in combination with the phosphors to produce a desired spectral output.

The heat-generating structure in the microelectronic device, in one embodiment of the invention, may comprise an LED, e.g., an LED fabricated of GaN or other III-V nitride or a component or structure formed of other material that generates or passively accumulates unwanted heat during the operation of the microelectronic device.

The invention therefore contemplates a microelectronic device generating heat in operation of the device, and an upconverting material arranged to reduce the thermal energy of the device and/or to produce light in the visible spectrum, in exposure of the upconverting material to such heat. The microelectronic device can comprise a light emitting diode or a laser diode or other suitable device structure.

A microelectronic device of the invention may be constructed to include multiple upconverting materials, including a first upconverting material that is responsive to thermal energy to produce upconverted light, and a second upconverting material that produces upconverting light in response to heat, upconverted light from the first upconverting material or another source, and/or energy from an active region of the microelectronic device.

Alternatively, the microelectronic device may be a device that in operation generates or includes component(s) that generate heat, in which the device comprises an upconverting material that produces upconverted light in response to heat, an external light source and/or energy from an active region of the microelectronic device.

More generally, the device may be a microelectronic device that in operation generates or includes component(s) that generate heat, in which the device comprises a heat conversion medium that converts such heat to a light emission that is effective to dissipate such heat.

Such device may further include a down-converting material, wherein the second upconverting material is responsive to energy produced by the down-converting material.

As another conformation, the microelectronic device may be fabricated to include an upconverting material and a down-converting material, each arranged for energetic interaction in the device. In one specific arrangement, the upconverting material produces upconverted light in response to energy produced by the down-converting material. The upconverting material can include an anti-Stokes phosphor or other suitable upconverting material, and the down-converting material can include a Stokes phosphor or other down-converting material of appropriate character.

Such microelectronic device may be configured so that the down-converting energy generated in operation of the device upconverts thermal energy to light energy. As another variant, the down-converting material may be arranged so that it is responsive to energy emitted from an active region of the microelectronic device, to produce downconverted light. As a still further variant, the microelectronic device may be configured so that upconverted and downconverted light in the visible spectrum are generated in the operation of the microelectronic device, by appropriate choice of materials. As another variant, an upconverting material (e.g., an anti-Stokes phosphor) may be arranged so that it is responsive to energy emitted from an active region of the microelectronic device and thermal energy to produce upconverted light.

The microelectronic device may be configured in another embodiment with a composite material comprising anti-Stokes phosphor and a Stokes phosphor.

The microelectronic device of the invention in another embodiment can include multiple upconverting and/or down-converting elements that are responsive to energy emitted by any of light emitting regions of the microelectronic device to produce a predetermined light output spectrum for the microelectronic device.

The invention therefore enables a method of thermally managing a microelectronic device generating heat in operation of the device, including reducing the thermal energy of the device by interaction thereof with an upconverting material and/or producing light in the visible spectrum, in exposure of the upconverting material to heat generated by the device.

In one implementation, the method of thermally managing a microelectronic device includes incorporating in such device an upconverting material that produces upconverted light in response to heat, an external light source and/or energy from an active region of the microelectronic device.

The thermal management of the microelectronic device may include incorporating multiple upconverting materials therein, including a first upconverting material that is responsive to thermal energy to produce upconverted light, and a second upconverting material produces upconverting light in response to thermal energy, the upconverted light and/or energy from an active region of the microelectronic device.

Further, a down-converting material can be incorporated in the microelectronic device, with the second upconverting material being responsive to energy produced by the down-converting material.

As another approach to thermally managing a microelectronic device, an upconverting material and a down-converting material can both be incorporated in the device, each arranged for energetic interaction in such device. In such approach, the upconverting material can produce upconverted light in response to energy produced by the down-converting material. The upconverting material can include an anti-Stokes phosphor or other suitable material or medium, and the down-converting material can include a Stokes phosphor or alternative material having suitable down-converting character.

Such thermal and/or operational management of the microelectronic device may include using downconverted energy generated in the operation of the device to upconvert thermal energy to light energy. Alternatively, or additionally, the down-converting material may be responsive to energy emitted from an active region of the microelectronic device, to produce downconverted light, and in specific embodiments, upconverted and downconverted light in the visible spectrum may be generated in the operation of the microelectronic device.

The invention further contemplates in one embodiment thereof a method of fabricating a microelectronic device, comprising incorporating in said microelectronic device multiple upconverting and/or down-converting elements that are responsive to energy emitted by any of light emitting regions of the microelectronic device to produce a predetermined light output spectrum for the microelectronic device.

It will therefore be appreciated that microelectronic devices of the invention may be fabricated in a variety of specific arrangements providing desired thermal management and/or light emission capability.

Specific illustrative embodiments of the invention are now described with reference to the accompanying drawings of FIGS. 1-4.

Referring now to the drawings, FIG. 1 is an elevation view, in partial section, of an optoelectronic light emission assembly 10 including a light emitting diode 12 and a down-converting luminophoric medium 20 arranged to receive primary radiation from the light emitting diode, in which the optoelectronic light emission assembly includes an anti-Stokes phosphor film 24 on side surfaces of the light emitting diode support 22. The down-converting luminophoric medium 20 in this assembly is constituted as a film on the inside surface of cover 18 overlying the LED 12.

The LED assembly as shown may be reflectorized to directionally channel the output light of the assembly, and the LED support 22 may have the anti-Stokes phosphor deposited on side surfaces of the vertical post structure as well as on the base portion of such support, to maximize the cooling effect achieved by the anti-Stokes phosphor material.

In operation, the heat generated by the LED and associated componentry is conducted by a support 22 to the anti-Stokes phosphor film 24, which converts the inputted heat energy to light emission, thereby effecting cooling of the LED assembly. Additional cooling of the LED may be achieved through the use of cooling fins, thermoelectric coolers, etc., that contact the back surface of the lamp assembly.

Figure 2:
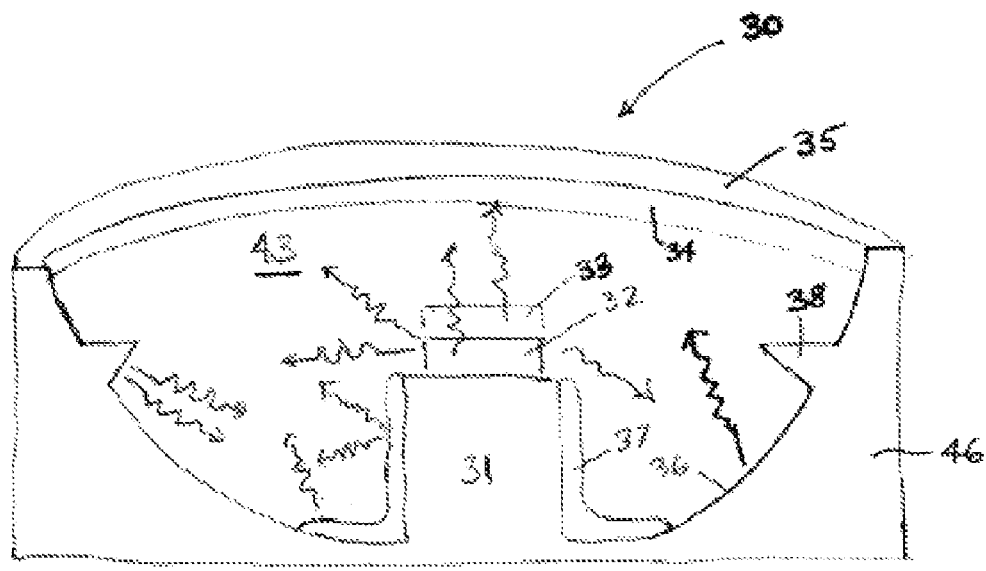
FIG. 2 is an elevation view, in cross-section, of an optoelectronic light emission assembly accordingly to another embodiment of the invention, including a first down-converting luminophoric medium, a second down-converting luminophoric medium, and an anti-Stokes phosphor film.

FIG. 2 is an elevation view, in cross-section, of an optoelectronic light emission assembly 30 accordingly to another embodiment of the invention, including a first down-converting luminophoric medium, a second down-converting luminophoric medium, and an anti-Stokes phosphor film.

The optoelectronic light emission assembly 30 includes a main body 46 defining a cavity therein partially enclosing an interior volume 43 of the assembly. The main body 46 has a reflecting surface 36 and includes a mounting post 31 on which a light emitting diode 32 is placed and electrically contacted. A down-converting luminophoric medium 33 overlies the light emitting diode 32 and is arranged to receive primary radiation from the light emitting diode 32. A second down-converting luminophoric material 34 is arranged in the assembly to receive light from the LED 32 and the down-converting luminophoric material 33.

The second down-converting luminophoric material 34 in this embodiment is provided as a coating on the transparent lens 35 that matingly engages the main body 46 to enclose the interior volume 43. Alternatively, such second down-converting luminophoric material could be provided as a free-standing film, e.g., reinforced with a suitable matrix material, or otherwise supported on other structure in the optoelectronic light emission assembly. An anti-Stokes phosphor film 37 is placed on side surfaces of the light emitting diode mounting post 31. The reflecting surface 36 includes features such as reflective protrusions 38 thereon that act to reflect some of the primary emission from the light emitting diode 32 onto the anti-Stokes phosphor film 37 to enable the cooling process. This arrangement thus provides an upconverting luminophoric material coated on or attached to at least a portion of light emitting diode mounting post 31, with the post constituting a heat transfer element that is adapted to remove heat in or from the microelectronic device.

Figure 3:
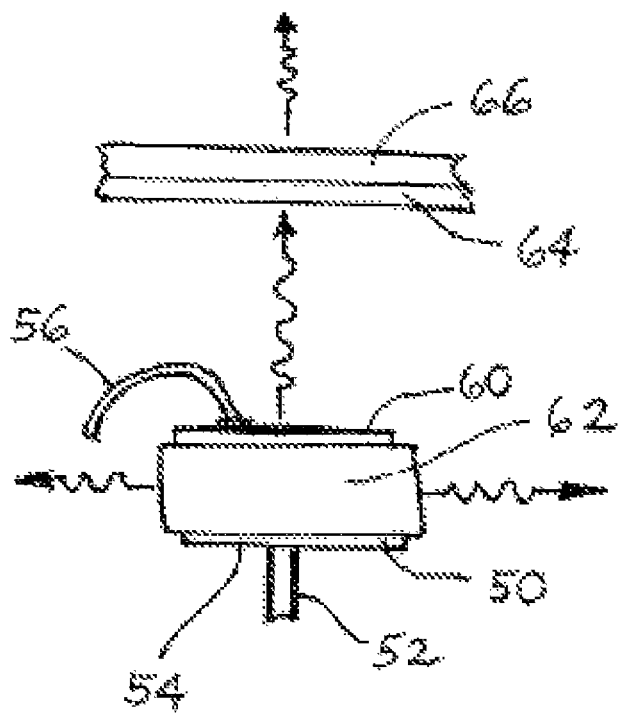
FIG. 3 is an elevation view, in partial section, of an optoelectronic device according to another embodiment of the invention.

FIG. 3 is an elevation view, in partial section, of an optoelectronic device according to another embodiment of the invention. In this device, the light emitting diode 50 is supported at its rear face 54 on support/electrical conductor 52, and the second electrical conductor 56 is arranged for contact with the emitting face 60 of such LED, as shown.

The LED 50 emits primary radiation that is impinged on a down-converting luminophoric medium film 64 that is arranged in receiving relationship to the LED, and that is formed on the facing surface of the light-transmissive sheet 66, to transmit light from the device.

In this embodiment, a circumscribing film 62 of anti-Stokes phosphor has been formed on the side surfaces of LED 50, so that heat generated in the LED body is conducted to the anti-Stokes phosphor film 62 and converted to light that is emitted from such anti-Stokes phosphor film. By such arrangement, the LED die is thermally managed for operation at a predetermined temperature, by the heat-dissipative action of the anti-Stokes phosphor film.

In another embodiment of the invention, the anti-Stokes phosphor may be utilized in combination with a conventional (Stokes) phosphor, such as in a composite coating that is arranged to receive a primary radiation from an LED or other primary radiation source. In high-energy operation, the conventional phosphor itself may develop excess enthalpy and become excessively hot, and such heat in the phosphor film then can be dissipated by the anti-Stokes phosphor component of such composite film. The particulate phosphors for such purpose may be dispersed in a suitable film-forming carrier, to form a corresponding coating composition.

Figure 4:
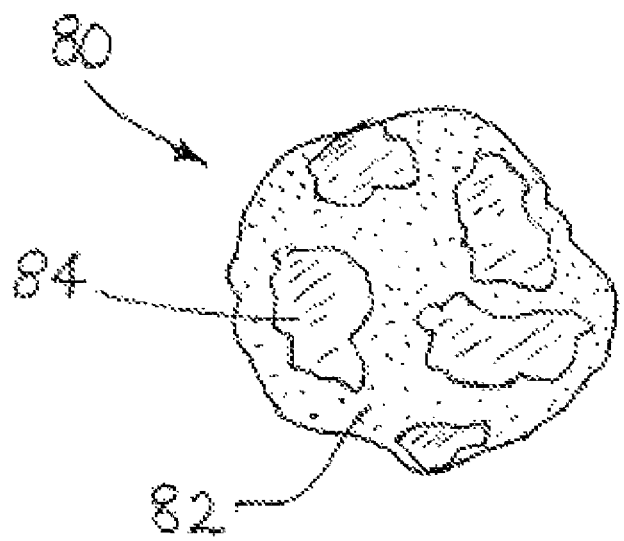
FIG. 4 is a perspective view of a composite phosphor particle, comprising a primary down-converting phosphor body having deposited thereon discontinuous film regions of an anti-Stokes phosphor.

FIG. 4 is a perspective view of a composite phosphor particle 80, comprising a primary down-converting phosphor body 82 having deposited thereon discontinuous film regions 84 of an anti-Stokes phosphor, such as may be suitable in a specific application to combat the heat-build up in the phosphor film. In lieu of such composite anti-Stokes phosphor/Stokes phosphor particles, the respective anti-Stokes and Stokes phosphors may be employed as discrete particles of each type, in admixture with one another. The anti-Stokes phosphor and the conventional phosphor may also be deposited as thin films using a conventional deposition technique such as chemical vapor deposition.

It will therefore be appreciated that the invention contemplates a wide variety of microelectronic device structures and arrangements, in which the upconverting luminophoric medium is used to convert waste heat energy to a light output and thereby dissipate such heat in the operation of the microelectronic device.

While the invention is primarily described herein in application to thermal management of optoelectronic devices, it will be recognized that the invention can be applied to the cooling of non-optical devices, e.g., thermal sensors, as well as microelectronic devices that utilize dedicated light source components, in which the existing light source componentry can be minimized or even eliminated by the capability of converting generated heat to light in accordance with the invention.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A microelectronic device comprising:
   a heat-generating structure adapted to emit a visible light output and to generate heat energy, wherein the heat-generating structure includes at least one of a light emitting diode and a down-converting luminophoric medium; and
   an upconverting luminophoric material that receives a portion of the heat energy and at least partially converts the portion of the heat energy to upconverted visible light in addition to the visible light emitted by the heat generating structure,
   wherein the microelectronic device radiates the visible light output emitted by the heat-generating structure and the upconverted visible light.

2. The microelectronic device of claim 1, wherein the upconverting luminophoric material comprises an anti-Stokes phosphor.

3. The microelectronic device of claim 2, wherein the upconverting luminophoric material comprises a material of the formula L:M, wherein L is yttrium oxide, yttrium fluoride, yttrium oxyfluoride, yttrium oxychloride, yttrium oxysulfide, or ytterbium oxychloride, and M is one or more of ytterbium, erbium, and thulium.

4. The microelectronic device of claim 2, wherein the upconverting luminophoric material comprises a material selected from the group consisting of $Y_2O_2S:Yb,Tm$; $La_2O_2S:Er,Yb$; $Y_2O_2S:Er,Yb$; $YF_3:Er,Yb$; $Y_2O_3$-YOF:Er,Yb; YOCl:Er,Yb; YbOCl:Er.

5. The microelectronic device of claim 1, wherein the upconverting luminophoric material is arranged to receive the portion of the heat energy from the heat-generating structure at least in part by conductive heat transfer.

6. The microelectronic device of claim 1, wherein the upconverting luminophoric material is arranged to receive the portion of the heat energy from the heat-generating structure at least in part by radiative heat transfer.

7. The microelectronic device of claim 1, wherein the heat-generating structure comprises the light emitting diode.

8. The microelectronic device of claim 7, wherein the light emitting diode is formed of a III-V nitride material.

9. The microelectronic device of claim 8, wherein the down-converting luminophoric material is arranged to receive primary radiation from the light emitting diode and to responsively emit the visible light output.

10. The microelectronic device of claim 9, wherein the heat-generating structure comprises the down-converting luminophoric material.

11. The microelectronic device of claim 1, comprising an optoelectronic device.

12. The microelectronic device of claim 1, wherein the heat-generating structure comprises the light emitting diode die and the down-converting luminophoric material.

13. The microelectronic device of claim 1, wherein the upconverting luminophoric material is present in a layer containing same that is coated on at least a portion of said device.

14. The microelectronic device of claim 1, wherein the upconverting luminophoric material is present in a layer containing same that is coated on at least a portion of said heat generating structure.

15. A microelectronic device generating a visible light output and heat energy in operation of the device, and an upconverting material arranged to receive a portion of the heat energy and to at least partially convert the portion of the heat energy into upconverted visible light in addition to the visible light emitted by the microelectronic device.

16. The microelectronic device of claim 15, comprising a heat-generating structure including a light emitting diode or a laser diode, wherein the heat-generating structure generates the visible light output and the heat energy.

17. A microelectronic device comprising:
a device configured to generate primary radiation and to radiate heat energy as a result of the generation of the primary radiation, wherein the device includes a down-converting material configured to receive a portion of the primary radiation and to partially down-convert the portion of the primary radiation to a first visible light output and to radiate at least a part of the heat energy; and
an upconverting material configured to receive at least a portion of the heat energy radiated and to partially upconvert the portion of the heat energy into a second visible light output that is emitted by the microelectronic device in addition to the first visible light output.

18. The microelectronic device of claim 17, wherein the upconverting material comprises an anti-Stokes phosphor, and the down-converting material comprises a Stokes phosphor.

19. A method of thermally managing an optoelectronic device configured to emit a visible light output and to generate heat, comprising absorbing a portion of the heat with an upconverting luminophoric material that in exposure to the portion of the heat at least partially converts the portion of the heat to a heat-dissipative visible light output that is radiated together with the emitted visible light output.

20. The method of claim 19, wherein the upconverting luminophoric material comprises an anti-Stokes phosphor.

21. The method of claim 19, wherein the upconverting luminophoric material comprises a material of the formula L:M, wherein L is yttrium oxide, yttrium fluoride, yttrium oxyfluoride, yttrium oxychloride, yttrium oxysulfide, or ytterbium oxychloride, and M is one or more of ytterbium, erbium, and thulium.

22. The method of claim 19, wherein the upconverting luminophoric material comprises a material selected from the group consisting of $Y_2O_2S:Yb,Tm$; $La_2O_2S:Er,Yb$; $Y_2O_2S:Er,Yb$; $YF_3:Er,Yb$; $Y_2O_3$-YOF:Er,Yb; YOCl:Er,Yb; YbOCl:Er.

23. The method of claim 19, wherein the upconverting luminophoric material is arranged to receive the portion of the heat from a heat-generating structure of the optoelectronic device by conductive heat transfer or by radiative heat transfer.

24. The method of claim 19, wherein the optoelectronic device includes a light emitting diode and a down-converting luminophoric material arranged to receive primary radiation from the light emitting diode and to responsively emit the visible light output.

25. The method of claim 24, wherein the heat is generated in the down-converting luminophoric material.

26. A method of thermally managing an optoelectronic device generating a visible light output and heat energy in operation of the optoelectronic device, comprising reducing the heat energy of the device by thermally coupling an upconverting material with the optoelectronic device, wherein the upconverting material is configured to convert a portion of the heat energy into a heat-dissipative visible light output that is radiated together with the visible light output.

27. The method of claim 26, wherein the optoelectronic device comprises a light emitting diode or a laser diode.

28. A method of thermally managing an optoelectronic device, comprising incorporating an upconverting material and a down-converting material therein, wherein the down-converting material is configured to receive a portion of a primary radiation from the optoelectronic device and to partially convert the portion of the primary radiation into visible light energy and heat energy, and wherein the upconverting material is configured to receive a portion of the heat energy and to partially convert the portion of the heat energy into a heat-dissipative visible light output that is radiated together with the visible light energy converted by the down-converting material.

29. The method of claim 28, wherein the upconverting material comprises an anti-Stokes phosphor and the down-converting material comprises a Stokes phosphor.

30. A method of fabricating a microelectronic device, comprising incorporating in said microelectronic device multiple upconverting and/or down-converting elements that are responsive to energy emitted by any of light emitting regions of the microelectronic device to produce a visible light output as part of a predetermined visible light output spectrum for the microelectronic device, wherein the multiple upconverting and/or down-converting elements include at least one upconverting element configured to convert at least a portion of heat energy generated by the microelectronic device into a heat-dissipative visible light output that is radiated with the visible light output of the microelectronic device as part of the predetermined light output spectrum for the microelectronic device.

31. A microelectronic device that in operation generates or includes component(s) that generate visible light and heat, the device comprising a heat conversion medium, including an emissive conversion material that converts at least a portion of said heat into a heat-dissipative visible light emission having a shorter wavelength than said heat radiation, and wherein the heat-dissipative visible light emission is radiated together with the visible light generated.

32. The microelectronic device of claim 31, wherein said heat-dissipative visible light emission is effective to cool the microelectronic device.

33. The microelectronic device of claim 31, wherein said heat-dissipative visible light emission is effective to cool the microelectronic device to a greater extent, in relation to a corresponding microelectronic device lacking said heat conversion medium wherein said heat is dissipated by radiative and conductive cooling of said microelectronic device.

34. The microelectronic device of claim 31, wherein heat is transferred from said microelectronic device or component(s) thereof to said heat conversion medium by at least one of conduction and radiation.

35. The microelectronic device of claim 31, wherein said heat conversion medium comprises multiple phosphor materials including an anti-Stokes phosphor.

36. The microelectronic device of claim 31, wherein said component(s) that generate heat comprise at least one of a down-converting luminophoric material and a light emitting diode.

37. A microelectronic device that in operation generates visible light and generates heat or includes component(s) that generate said heat, the microelectronic device comprising a heat conversion medium that converts said heat to a heat-dissipative visible light emission that is radiated by the microelectronic device together with the generated visible light.

38. A microelectronic device that in operation emits visible light and generates heat energy or includes component(s) that emit said visible light and generate the heat energy, in which the device comprises an upconverting material that receives at least a portion of the heat energy and partially upconverts at least a portion of the heat energy into upconverted visible light that is radiated together with the emitted visible light.

39. A method of thermally managing a microelectronic device configured to emit visible light, comprising incorporating therein an upconverting material that produces upconverted visible light in response to heat energy from at least one of an external light source and/or energy from an active region of the microelectronic device, and converts the heat energy into heat-dissipative visible light that is radiated together with the emitted visible light.

40. The microelectronic device of claim 15, comprising a heat-generating structure including (i) one of a light emitting diode or a laser diode; and (ii) a down-converting luminophoric material, wherein the heat-generating structure generates the visible light output and the heat energy.

41. The method of claim 26, wherein the optoelectronic device comprises (i) one of a light emitting diode or a laser diode; and (ii) a down-converting luminophoric material.

* * * * *